United States Patent
Koehler et al.

(10) Patent No.: US 9,829,548 B2
(45) Date of Patent: Nov. 28, 2017

(54) METHOD AND APPARATUS TO DETERMINE A SUBJECT-SPECIFIC B1 DISTRIBUTION OF AN EXAMINATION SUBJECT IN A MEASUREMENT VOLUME OF A MAGNETIC RESONANCE APPARATUS

(71) Applicants: Michael Koehler, Nuremberg (DE); Thorsten Speckner, Erlangen (DE)

(72) Inventors: Michael Koehler, Nuremberg (DE); Thorsten Speckner, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 1217 days.

(21) Appl. No.: 13/906,649

(22) Filed: May 31, 2013

(65) Prior Publication Data

US 2013/0320977 A1 Dec. 5, 2013

(30) Foreign Application Priority Data

Jun. 1, 2012 (DE) .................. 10 2012 209 295

(51) Int. Cl.
*G01R 33/32* (2006.01)
*G01R 33/44* (2006.01)
*G01R 33/24* (2006.01)

(52) U.S. Cl.
CPC .......... *G01R 33/32* (2013.01); *G01R 33/246* (2013.01); *G01R 33/44* (2013.01)

(58) Field of Classification Search
USPC .......................... 324/300–322; 600/407–435; 382/128–131
See application file for complete search history.

(56) References Cited

U.S. PATENT DOCUMENTS

| | | | | |
|---|---|---|---|---|
| 4,812,761 A | * | 3/1989 | Vaughan, Jr. ...... | G01R 33/3415 324/307 |
| 6,127,825 A | | 10/2000 | Goto | |
| 6,222,365 B1 | | 4/2001 | Taniguchi et al. | |

(Continued)

OTHER PUBLICATIONS

Saranathan et al.; "Fast 3D B1+ mapping using an optimized, asymmetric Bloch-Siegert method"; Proc. Intl. Soc. Mag.Reson. Med. 19; pp. 577; (2011).

(Continued)

*Primary Examiner* — Melissa Koval
*Assistant Examiner* — Tiffany Fetzner
(74) *Attorney, Agent, or Firm* — Schiff Hardin LLP

(57) ABSTRACT

In a magnetic resonance method and apparatus to determine a subject-specific B1 distribution of an examination subject in a measurement volume in the magnetic resonance apparatus, a first measurement data set of the examination subject is acquired using a first pulse sequence, a second measurement data set of the examination subject is acquired using a second pulse sequence, and a third measurement data set of the examination subject is acquired using a third pulse sequence. A first phase is determined from the first measurement data set, a second phase from the second measurement data set and a third phase from the third measurement data set. A relevant phase shift is calculated from the first phase, the second phase and the third phase, and the B1 distribution are determined from the calculated relevant phase shift.

9 Claims, 4 Drawing Sheets

(56) References Cited

U.S. PATENT DOCUMENTS

| | | | |
|---|---|---|---|
| 6,268,728 B1 | 7/2001 | Morrell | |
| 9,625,546 B2 * | 4/2017 | Koehler | G01R 33/443 |
| 2007/0108976 A1 | 5/2007 | Morich et al. | |
| 2007/0145975 A1 | 6/2007 | Feiweier et al. | |
| 2008/0150528 A1 | 6/2008 | Cunningham et al. | |
| 2008/0231270 A1 | 9/2008 | Fontius et al. | |
| 2010/0315084 A1 | 12/2010 | Sacolick et al. | |
| 2011/0025327 A1 | 2/2011 | Deoni et al. | |
| 2013/0207653 A1 | 8/2013 | Ito et al. | |
| 2013/0234704 A1 * | 9/2013 | Hurlimann | G01N 24/081 324/303 |
| 2013/0234705 A1 * | 9/2013 | Mandal | G01N 24/081 324/309 |
| 2013/0234706 A1 * | 9/2013 | Mandal | G01N 24/081 324/303 |
| 2013/0320977 A1 * | 12/2013 | Koehler | G01R 33/32 324/309 |
| 2014/0218021 A1 * | 8/2014 | Koehler | G01R 33/443 324/301 |

OTHER PUBLICATIONS

Basse-Lüsebrink et al.; "Fast CPMG-Based Bloch-Siegert B+1 Mapping"; Magnetic Resonance in Medicine 67; pp. 405-418; (2011).

Sturm; "Improved Encoding Strategy for CPMG-Based Bloch-Siegert B+1 Mapping"; Imaging Methodology—Notes Magnetic Resonance in Medicine 68; pp. 507-515; (2011).

Cunningham et al., "Saturated double-angle method for rapid B1+mapping"., Magnetic Resonance in Medicine, pp. 1326-1333, (2006).

Sacolick et al., "B1 Mapping by Bloch-Siegert Shift," Magnetic Resonance in Medicine 63, pp. 1315-1322 (2010).

Chung et al., "Rapid B1+ Mapping Using a Preconditioning rF Pulse with TurboFLASH Readout," Magnetic Resonance in Medicine 64; pp. 439-446 (2010).

Yarnykh "Actual Flip-Angle Imaging in the Pulsed Steady State: A Method for Rapid Three-Dimensional Mapping of the Transmittal Radiofrequency Field," Magnetic Resonance in Medicine 57: pp. 192-200 (2007).

Khalighi et al., "RF Pulse Optimization for Bloch-Siegert B+1 Mapping," Magnetic Resonance in Medicine pp. 1-6 (2011).

* cited by examiner

METHOD AND APPARATUS TO DETERMINE A SUBJECT-SPECIFIC B1 DISTRIBUTION OF AN EXAMINATION SUBJECT IN A MEASUREMENT VOLUME OF A MAGNETIC RESONANCE APPARATUS

BACKGROUND OF THE INVENTION

Field of the Invention

The present invention concerns a method to determine a subject-specific B1 distribution of an examination subject in a measurement volume in a magnetic resonance apparatus, as well as a magnetic resonance apparatus and an electronically readable data storage medium to implement such a method.

Description of the Prior Art

Magnetic resonance (MR) is a known technique or modality with which images of the inside of an examination subject can be generated. Described in a simplified manner, the examination subject is positioned in a strong, static, homogeneous basic magnetic field (called a B0 field) with a field strength of 0.2 to 7 Tesla or more, that causes nuclear spins in the subject to orient along the basic magnetic field. For spatial coding of the measurement data, rapidly switched gradient fields are superimposed on the basic magnetic field. Radio-frequency (RF) excitation pulses (RF pulses) are radiated into the examination subject to trigger nuclear magnetic resonances.

The flux density of the radiated RF pulses is typically designated with B1. The pulse-shaped radio-frequency field is therefore generally also shortened to "B1 field". The nuclear spins of the atoms in the examination subject are thereby excited by these radio-frequency pulses such that they are deflected out of their steady state (parallel to the basic magnetic field B0) by what is known as an "excitation flip angle" (also shortened to "flip angle"). The nuclear spins then precess around the direction of the basic magnetic field B0. The magnetic resonance signals that are thereby generated are acquired by radio-frequency reception antennas (reception coils). The acquired measurement data (also called k-space data) are digitized and stored as complex numerical values (raw data) in a k-space matrix. By means of a multidimensional Fourier transformation, an associated MR image can be reconstructed from the k-space matrix populated with values. In addition to anatomical images, spectroscopy data, movement data or temperature data of an examined or, respectively, treated area can also be determined with the aid of the magnetic resonance technique.

The measured signals thus also depend on the radiated RF pulses. Typical methods for reconstruction of image data sets from magnetic resonance signals assume a homogenous RF field distribution (B1 field distribution) in the examination volume in addition to a homogenous basic magnetic field and strong linear gradient magnetic fields. In real MR systems, however, the B1 field distributions typically vary spatially in the examination volume, which leads to image inhomogeneities (image artifacts) in the MR images reconstructed from the signals, and therefore to a poorer ability to detect the imaged examination subject. Particularly in the case of whole-body imaging or acquisitions of the torso (chest, abdomen, pelvis), artificial shadows in the image occur due to an inhomogeneous RF field distribution at basic magnetic fields of 3 Tesla or more.

Furthermore, an optimally precise knowledge of the B1 fields present in the examination subject is essential for many applications of magnetic resonance tomography, for example for the pulse calculation in multichannel transmission operation or for quantitative T1 examinations. Due to the subject-specific conductivity and susceptibility distributions, spatially dependent variations of the B1 field that are pronounced in high static magnetic fields (in particular at 3T or more) can occur. Therefore, a subject-specific determination of the actually present B1 distribution at a set transmission power is necessary for many applications.

Methods are known to determine the subject-specific B1 distribution. For example, a method in which the B1 distribution is determined from the flip angle distribution is described in the article by Cunningham et al., "Saturated Double-Angle Method for Rapid B1+ Mapping", Magn. Reson. Med. (2006) 55: Pages 1326-1333. However, this method is not sufficiently precise for specific flip angles (for example 90°). The acceleration of the method that is described in the article leads to a sensitivity to resonance shifts and limits the dynamic range of the method. Without the acceleration, the method requires a long measurement time.

In "Rapid B1+ Mapping Using a Preconditioning RF Pulse with TurboFLASH Readout", Magn. Reson. Med. (2010) 64: Pages 439-446, Chung et al. describe a method to determine the B1 distribution in which a slice-selective preconditioning RF pulse is radiated and that is measured via this reduced longitudinal magnetization from which the B1 distribution is determined. Although this method is relatively fast, it is sensitive to the distribution of the T1 relaxation times in the examination subject, which are not always sufficiently known.

In "Actual Flip-Angle Imaging in the Pulsed Steady State: A Method for Rapid Three-Dimensional Mapping of the Transmitted Radiofrequency Field", Magn. Reson. Med. (2007) 57: Pages 192-200, Yarnykh describes a method in which an AFI pulse sequence (AFI: "actual flip angle") is used which comprises two identical RF pulses followed by two different wait times TR1 and TR2 that respectively generate an echo signal following each RF pulse. The current flip angles of the RF pulses (and therefore the B1 distribution) can be calculated with the aid of the generated and measured echo signals. However, as a three-dimensional (3D) method this method is particularly sensitive to movements.

Another method in order to determine the spatially dependent B1 field amplitudes (thus the B1 distribution) of an examination subject is the utilization of the Bloch-Siegert phase shift as it is described by Sacolick et al. in "B1 Mapping by Bloch-Siegert Shift", Magn. Reson. Med. (2010) 63: Pages 1315-1322. The Bloch-Siegert phase shift arises via radiation of a non-resonant RF pulse (called a Bloch-Siegert pulse in the following). The generated phase shift is thereby proportional to the square of the B1 amplitude:

$$\phi_{BS} = \left(B_1^{peak}\right)^2 \int_0^T \frac{(\gamma B_1^{norm}(t))^2}{4\pi} dt \cdot \frac{1}{\nu_{RF}} = k \frac{1}{\nu_{RF}}. \quad (1)$$

$\gamma$ designates the gyromagnetic ratio, $B_1^{norm}(t)$ designates the time curve of the Bloch-Siegert pulse normalized to the amplitude $B_1^{peak}$, and $\nu_{RF}$ designates the difference of the frequency of the Bloch-Siegert pulse relative to the resonance frequency. The integration extends over the entire pulse duration; here the frequency of the RF pulse is assumed to be temporally constant. In the underlying method here, the amplitude $B_1^{peak}$ of the Bloch-Siegert pulse is calculated from the measured phase shift $\phi_{BS}$ for a selected transmission power. A schematic representation of a sequence for the Bloch-Siegert method in gradient echo realization as in the cited article by Sacolick et al. is shown in FIG. 1.

In "RF Pulse Optimization for Bloch-Siegert B1+ Mapping", Magn. Reson. Med. (2011) DOI: 10.1002/mrm.23271, Khalighi et al. describe a method in which resonance shifts due to spatially dependent inhomogeneities of the static B0 field, due to chemical shift and due to susceptibility differences are taken into account and corrected in the calculation of the B1 amplitude using a pre-generated B0 map. However, inaccuracies and errors of the B0 map hereby also propagate in the calculation of the B1 amplitude.

SUMMARY OF THE INVENTION

An object of the invention is to provide a method, a magnetic resonance system, and an electronically readable data storage medium with which an adulteration of a determined B1 amplitude due to unknown shifts of the resonance frequency is reliably avoided.

The invention is based on the following considerations: from Equation (1) it is clear that deviations of the spin resonance frequency from the adjusted system frequency adulterate the result. If the resonance frequency of a spin deviates by $\pm \Delta v$ from the system frequency, this spin experiences a phase shift. The entire phase $\phi_{BS}$ of the spin is thus:

$$\phi'_{BS} = \phi^{ref} + k\frac{1}{v_{RF} \mp \Delta v}, \quad (2)$$

with the phase shift $$k\frac{1}{v_{RF} \mp \Delta v}$$

produced by the Bloch-Siegert pulse, depending on the deviation $\pm \Delta v$.

In order to limit the adulteration of the calculated B1 amplitude that results from this to the first order, in Sacolick et al. it is proposed to implement two measurements in which identical Bloch-Siegert pulses are played out with frequencies shifted by $+v_{RF}$ and $-v_{RF}$ relative to the system frequency. The phase shift of these two acquisitions is halved, and the B1 amplitude is calculated from this according to Equation (1).

The phases $\phi^+$ and $\phi^-$ are measured in the measurements with the Bloch-Siegert pulses shifted by $+v_{RF}$ or, respectively, $-v_{RF}$ relative to the system frequency:

$$\phi^+ = \phi^{ref} + k\frac{1}{v_{RF} - \Delta v}, \quad (3)$$

$$\phi^- = \phi^{ref} - k\frac{1}{v_{RF} + \Delta v}. \quad (4)$$

$\phi^{ref}$ designates the reference phase, i.e. the phase position without any Bloch-Siegert phase shift (which is not measured in the method according to Sacolick).

The halved difference of the two measured phases $\phi^+$ and $\phi^-$ results as $$\phi_{BS} = \frac{1}{2}(\phi^+ - \phi^-) = \frac{1}{2}k\left(\frac{1}{v_{RF} - \Delta v} + \frac{1}{v_{RF} + \Delta v}\right). \quad (5)$$

The value determined in such a manner is used in order to calculate the amplitude $B_1^{peak}$ of the B1 field according to Equation (1). However, the resonance shift $\Delta v$ also still plays a role here.

Since the Bloch-Siegert phase shift follows a nonlinear dependency on the frequency shift $v_{RF}$ of the Bloch-Siegert pulse, the danger thus furthermore exists that the determined B1 amplitude is adulterated to a not-insignificant degree for non-resonant spins. Variations of the resonance frequency $\Delta v$ can be caused by chemical shift, inhomogeneities of the static B0 field and susceptibility differences, for example.

This sensitivity of the Bloch-Siegert method to differences of the resonance frequency $\Delta v$ can be reduced in that the frequency shift $v_{RF}$ of the Bloch-Siegert pulse is chosen to be sufficiently large relative to the system frequency. The error that arises due to variations of the spin resonance frequency can therefore be limited (see also, for example, the cited article by Sacolick et al.). Given a fixed transmission power, however, the Bloch-Siegert phase shift $\phi_{BS}$ thereby decreases (see Equation (1)). The relative error of the measured B1 amplitude that is due to statistical fluctuations consequently increases, which is in particular problematic for the measurement of small B1 amplitudes (and therefore small phase shifts $\phi_{BS}$ in any case).

A method according to the invention to determine a subject-specific B1 distribution of an examination subject in a measurement volume in the magnetic resonance technique includes operating an MR data acquisition unit to obtain first measurement data set of the examination subject using a first pulse sequence, operating the MR data acquisition unit to obtain a second measurement data set of the examination subject using a second pulse sequence, operating the MR data acquisition unit to obtain a third measurement data set of the examination subject using a third pulse sequence, in a processor, determining a first phase from the first measurement data set, a second phase from the second measurement data set and a third phase from the third measurement data set, in the processor, calculating a relevant phase shift from the first phase, the second phase and the third phase, in the processor, determining the B1 distribution from the calculated relevant phase shift and making the determined B1 distribution available as a data file in the processor.

Influences of resonance shifts on the determination of the B1 distribution can be avoided by the acquisition of first, second and third phases using a respectively determined pulse sequence and using all three measured phases to calculate a relevant phase shift, from which a B1 distribution can be determined.

A magnetic resonance system according to the invention has a basic field magnet, a gradient field system, a radio-frequency antenna, a control device to control the gradient field system and the radio-frequency antenna, and a system computer to process acquired measurement data; and is designed to implement a described method.

The present invention also encompasses a non-transitory, computer-readable data storage medium encoded with programming instructions that, when the storage medium is loaded into a computerized control and processing system of a magnetic resonance apparatus, caused the magnetic resonance apparatus to be operated to implement any of the embodiments of the method described above.

The advantages and embodiments specified with regard to the method analogously apply to the magnetic resonance system and the electronically readable data storage medium.

DESCRIPTION OF THE PREFERRED EMBODIMENTS

Figure 1:
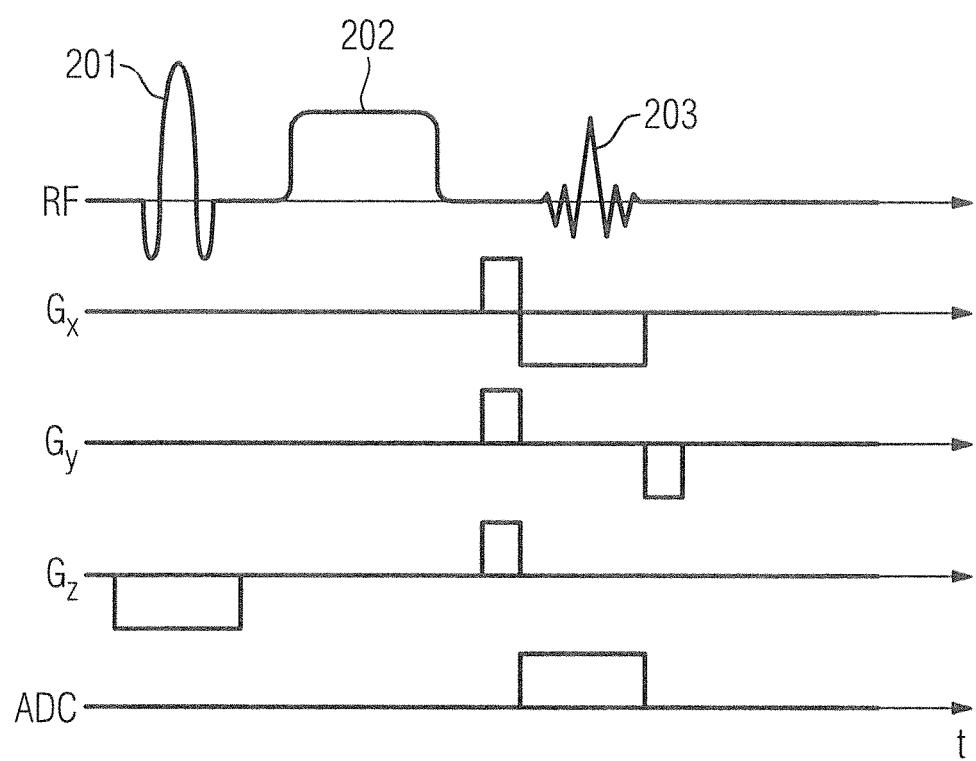
FIG. 1 is a schematic illustration of a sequence for the Bloch-Siegert method in gradient echo realization according to the prior art.

FIG. 1 shows a sequence for the Bloch-Siegert method in gradient echo realization according to the prior art. Shown one below the other are radiated or generated radio-frequency pulses or signals (RF), the gradients to be switched in the x-, y- and z-direction ($G_x$, $G_y$, $G_z$), and the readout action (ADC) over the course of time (t).

A non-resonant RF pulse 202 (here what is known as the Bloch-Siegert pulse) follows after an RF excitation pulse 201 with which a slice-selection gradient is simultaneously switched in the z-direction. The generated echo signal 203 is read out while switching the desired spatial coding gradients. This pulse sequence is repeated in a known manner with different spatial coding gradients $G_x$, $G_y$, $G_z$ until the entirety of desired k-space is scanned.

Figure 2:
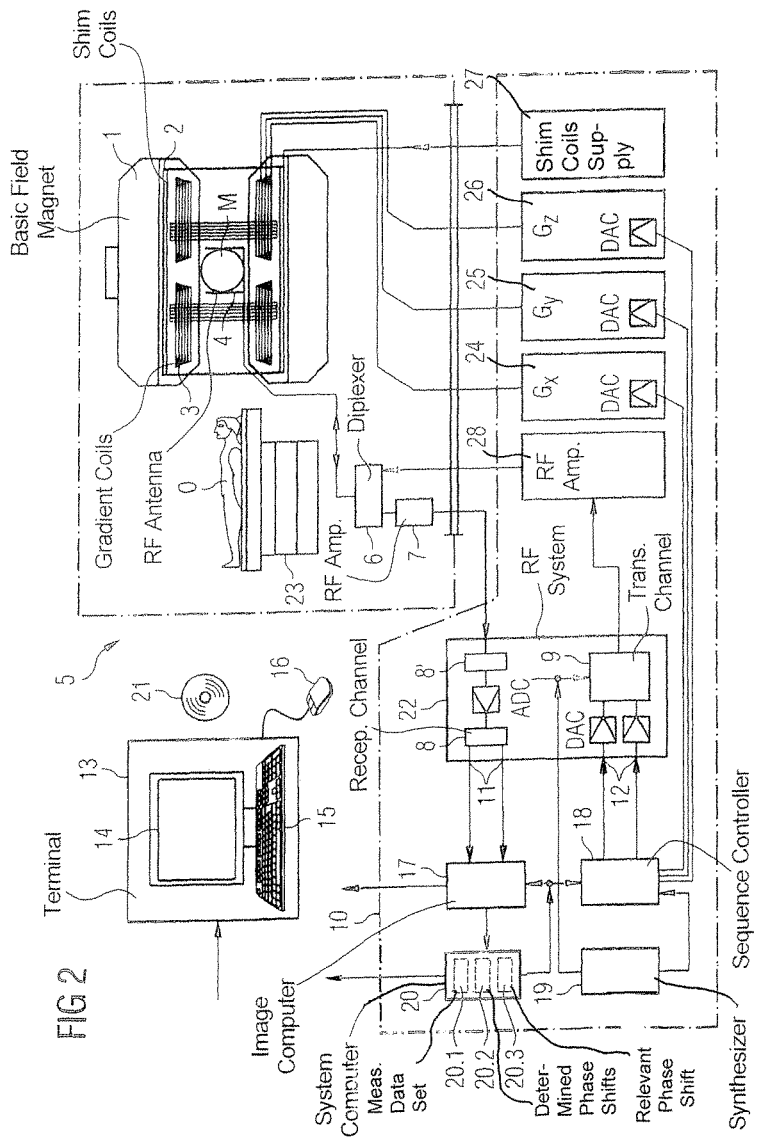
FIG. 2 schematically illustrates a magnetic resonance system according to the invention.

FIG. 2 shows a magnetic resonance system 5 (a magnetic resonance imaging (magnetic resonance tomography) apparatus). A basic field magnet 1 generates a temporally constant, strong magnetic field for polarization or alignment of the nuclear spins in an examination region of an examination subject U, for example of a part of a human body that is to be examined, which body lies on a table 23 and is slid into the magnetic resonance system 5. The high homogeneity of the basic magnetic field that is required for the magnetic resonance measurement (data acquisition) is defined in a typically spherical measurement volume M into which the parts of the human body that are to be examined are introduced. Shim plates made of ferromagnetic material are attached at a suitable point to assist the homogeneity requirements, and in particular to eliminate temporally invariable influences. Temporally variable influences are eliminated by shim coils 2 and a suitable control 27 for the shim coils 2.

A cylindrical gradient coil system 3 composed of three sub-windings is used in the basic field magnet 1. Each sub-winding is supplied with current by a corresponding amplifier 24-26 to generate a linear gradient field in a respective direction of the Cartesian coordinate system. The first sub-winding of the gradient field system 3 generates a gradient $G_x$ in the x-direction; the second sub-winding generates a gradient $G_y$ in the y-direction; and the third sub-winding generates a gradient $G_z$ in the z-direction. Each of the amplifiers 24-26 has a digital/analog converter (DAC), which is activated by a sequence controller 18 for accurately-timed generation of gradient pulses.

A radio-frequency antenna 4 that converts the radio-frequency pulses emitted by a radio-frequency power amplifier into an alternating magnetic field for excitation of the nuclei and alignment of the nuclear spins of the subject to be examined or of the region of the subject that is to be examined is located within the gradient field system 3. The radio-frequency antenna 4 is composed of one or more RF transmission coils and one or more RF reception coils in the form of an annular, linear or matrix-like arrangement, for example. The alternating field emanating from the precessing nuclear spins—i.e. normally the nuclear spin echo signals caused by a pulse sequence composed of one or more radio-frequency pulses and one or more gradient pulses—is also converted by the RF reception coils of the radio-frequency antenna 4 into a voltage (measurement signal), which is supplied via an amplifier 7 to radio-frequency reception channels 8, 8' of a radio-frequency system 22. The radio-frequency system 22 furthermore has a transmission channel 9 in which the radio-frequency pulses are generated for the excitation of nuclear magnetic resonance. The respective radio-frequency pulses are digitally represented in the sequence controller 18 as a series of complex numbers based on a pulse sequence predetermined by the system computer 20. This number sequence is supplied as a real part and imaginary part to a digital/analog converters (DAC) in the radio-frequency system 22 via respective inputs 12 and from said digital/analog converter (DAC) to the transmission channel 9. In the transmission channel 9 the pulse sequences are modulated on a radio-frequency carrier signal having a base frequency that corresponds to the resonance frequency of the nuclear spins in the measurement volume. The modulated pulse sequences of the RF transmission coils are supplied to the radio-frequency antenna 4 via an amplifier 28.

Switching from transmission operation to reception operation takes place via a transmission/reception diplexer 6. The RF transmission coil of the radio-frequency antenna 4 radiates the radio-frequency pulses for excitation of the nuclear spins into the measurement volume M and scans resulting echo signals via the RF reception coils. The acquired nuclear magnetic resonance signals are phase-sensitively demodulated to an intermediate frequency in a first demodulator 8' of the reception channel of the radio-frequency system 22 and are digitized in an analog/digital converter (ADC). This signal is further demodulated to a frequency of zero. The demodulation to a frequency of zero and the separation into real part and imaginary part occur in a second demodulator 8 after the digitization in the digital domain. The demodulator 8 supplies the demodulated data to an image computer 17 via outputs 11. An MR image can be reconstructed by the image computer 17 from the measurement data acquired in such a manner.

The administration of the measurement data, the image data and the control programs takes place via the system computer 20. The system computer 20 has a module to determine a phase shift of a measurement data set 20.1, a module to calculate a relevant phase shift from determined phase shifts 20.2, and a module to determine a B1 distribution from a relevant phase shift 20.3. The intermediate results (that arise in the processing of the measurement data in the system computer 20) and results—in particular specific B1 distributions—can be stored and/or displayed for further use, for example in subsequent MR measurements.

Based on a specification with control programs, the sequence controller 18 monitors the generation of the respective desired pulse sequences and the corresponding scanning of k-space. In particular, the sequence controller 18 controls the time-accurate switching of the gradients, the emission of the radio-frequency pulses with defined phase amplitude and the reception of the nuclear magnetic resonance signals. The time base for the radio-frequency system 22 and the sequence controller 18 is provided by a synthesizer 19. The selection of corresponding control programs to generate an MR image (which control programs are stored on a DVD 21, for example) and other inputs on the part of the user (such as a desired frequency, in particular of non-resonant RF pulses) and a presentation of generated MR images take place via a terminal 13 that has input means to enable an input (for example a keyboard 15 and/or a mouse 16) and display means (a monitor 14, for example) to enable a display.

Figure 3:
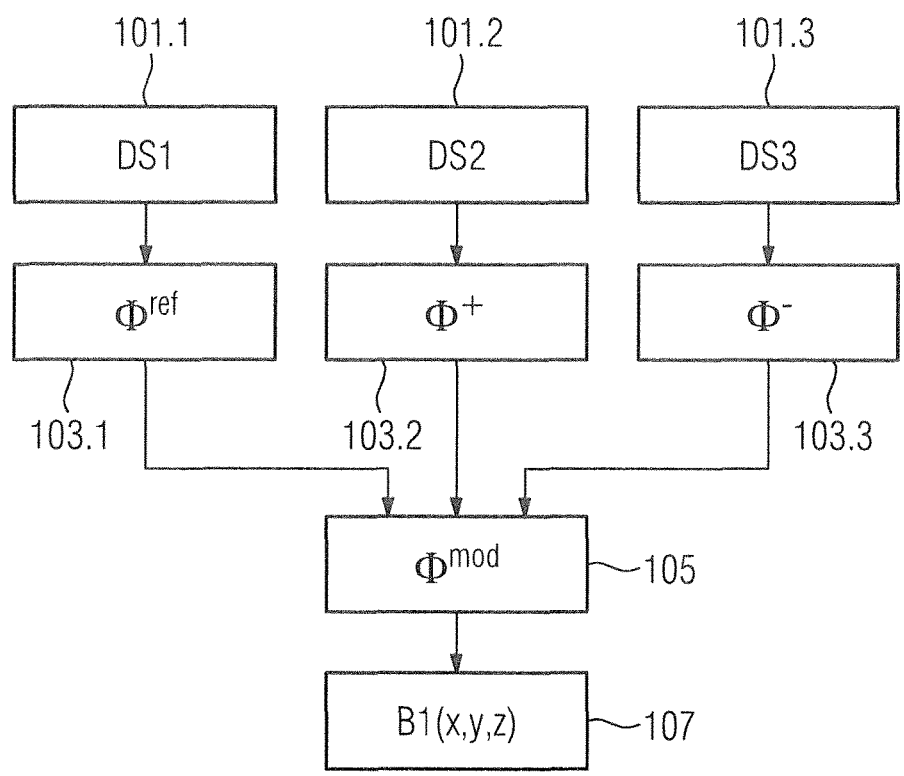
FIG. 3 is a flowchart of an embodiment a method according to the invention.

FIG. 3 shows a schematic flowchart of a method according to the invention.

Initially, a first measurement data set (DS1) of the examination subject is measured using a first pulse sequence (Block 101.1), a second measurement data set (DS2) of the examination subject is measured using a second pulse sequence (Block 101.2), and a third measurement data set (DS3) of the examination subject is measured using a third pulse sequence (Block 101.3).

The second and third pulse sequence thereby differ from the first pulse sequence only by a respective non-resonant RF pulse after every RF excitation pulse. The first, second and third measurement data set are therefore well comparable since only the phase shifts with which each of the measurement data sets is affected differ.

The first pulse sequence includes no non-resonant RF pulse at all, and can thus be used as a reference measurement. Examples of first, second and third pulse sequences are described below with regard to FIG. 4.

The non-resonant RF pulse of the second pulse sequence is shifted by a frequency value $v_2$ relative to the system frequency, i.e. the frequency of the RF excitation pulse. The non-resonant RF pulse of the third pulse sequence is shifted by a frequency value $v_3$ relative to the system frequency, i.e. the frequency of the RF excitation pulse. The system frequency is typically set to the (predominant) resonance frequency of the examined spin system. $v_2=-v_3=v_{RF}$ is advantageously selected.

Figure 4:
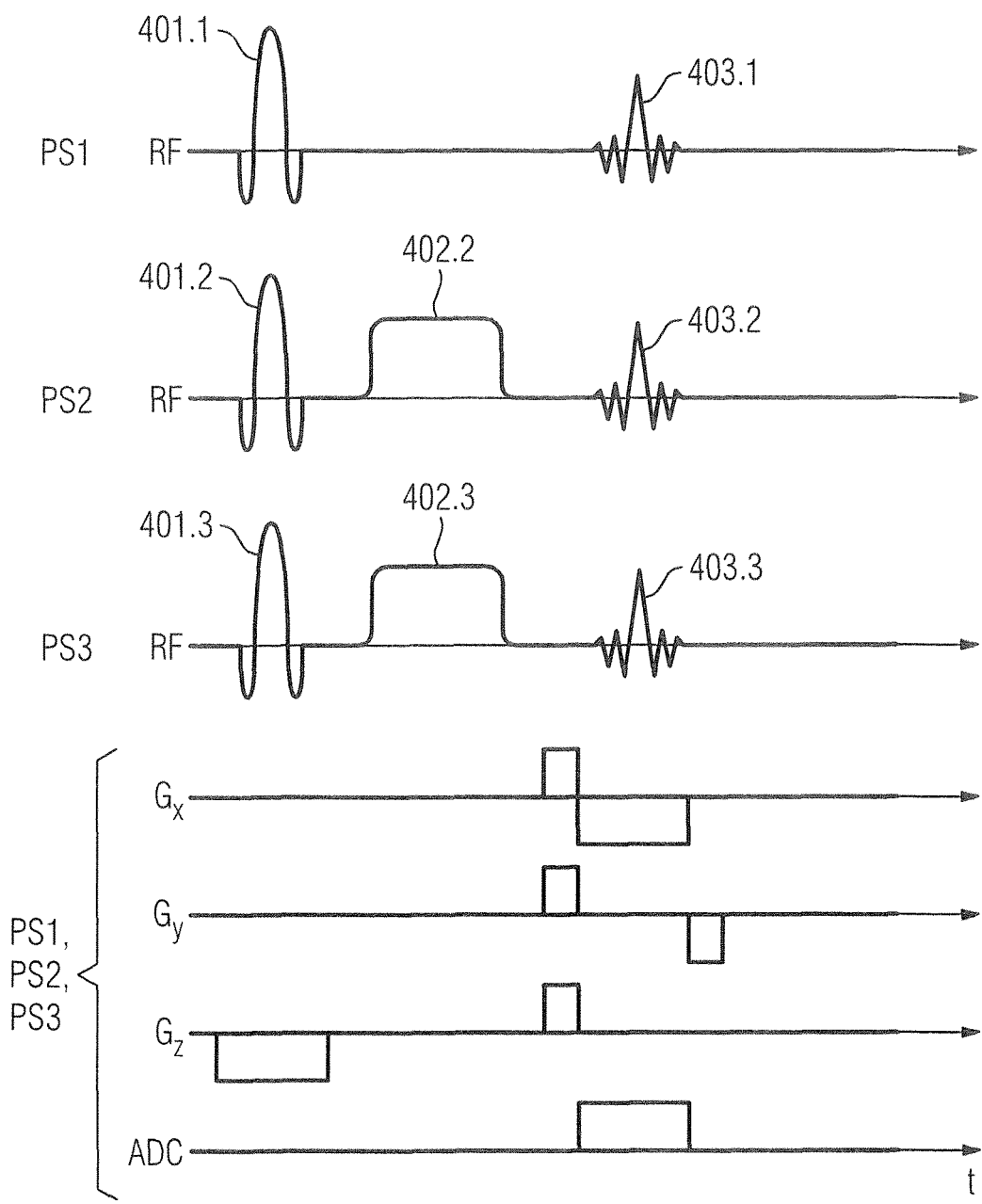
FIG. 4 is a schematic representation of first, second and third pulse sequences that can be used for the method according to the invention.

In this case, in addition to the two acquisitions with the non-resonant RF pulses shifted by $+v_{RF}$ and $-v_{RF}$ relative to the system frequency—which non-resonant RF pulses have already been measured in the prior art (Bloch-Siegert pulses there)—a measurement without non-resonant RF pulse is implemented given an otherwise unmodified sequence order (see also FIG. 4). The first phase—the reference phase $\phi^{ref}$ occurring in Equations (3) and (4)—is determined from this measurement (Block 103.1). The second phase (for example the phase $\phi^+$) is determined (Block 103.2) from the measurement using the second pulse sequence, in which the frequency of the non-resonant RF pulse is higher than the system frequency, for example. The third phase (for example the phase $\phi^-$) is determined (Block 103.3) from the measurement using the third pulse sequence, in which the frequency of the non-resonant RF pulse is lower than the system frequency, for example.

A relevant phase shift $\phi^{mod}$ is calculated (Block 105) from the three defined phases.

The phase shift that is required for the calculation of the B1 amplitude $B_1^{peak}$ (Block 107) according to Equation (1) is now calculated not via Equation (5) but rather in the following modified manner (Block 105) as a relevant phase shift $\phi^{mod}$:

$$\phi^{mod} = \phi_{BS}^{mod} = \frac{2}{\frac{1}{\phi^{ref}-\phi^-} + \frac{1}{\phi^+-\phi^{ref}}}. \quad (6)$$

With Equations (3) and (4), it results that:

$$\phi_{BS}^{mod} = k\frac{2}{v_{RF}+\Delta v+v_{RF}-\Delta v} = k\frac{1}{v_{RF}}. \quad (7)$$

A possibly occurring resonance shift $\Delta v$ is thus eliminated in the calculation. An adulteration due to resonance shifts therefore no longer occurs. Via the additional measurement of the reference phase $\phi^{ref}$, the inversely proportional connection between the Bloch-Siegert phase shift $\phi_{BS}^{mod}$ and the frequency of the non-resonant RF pulse $v_{RF}$ relative to the system frequency can be utilized in order to eliminate the effect of the resonance shifts.

Even when the frequency difference $v_2$ of the non-resonant RF pulse of the second pulse sequence from the system frequency does not have the same absolute value [magnitude] as the frequency difference $v_3$ of the non-resonant RF pulse of the third pulse sequence from the system frequency, even given the same algebraic signs of $v_2$ and $v_3$ it generally results that:

$$\phi_{BS}^{mod} = \frac{2}{\frac{1}{\phi^{ref}-\phi^-} + \frac{1}{\phi^+-\phi^{ref}}} = k\frac{2}{v_2+\Delta v+v_3-\Delta v} = k\frac{2}{v_2+v_3}. \quad (7)'$$

The calculation of the relevant phase shift $\phi^{mod}$ thus includes a subtraction of the first phase (the reference phase $\phi^{ref}$) from the smaller phase $\phi^-$ from the second and third phase, and a subtraction of the larger phase $\phi^+$ of the second and third phase from the first phase (the reference phase $\phi^{ref}$).

More precisely, the relevant phase shift can be calculated as the reciprocal of half of the sum of the reciprocal of the difference of the first phase $\phi^{ref}$ and the smaller phase $\phi^-$ from the second and third phase, and the reciprocal of the difference of the larger phase $\phi^+$ of the second and third phase and the first phase $\phi^{ref}$.

A first pulse sequence PS1, a second pulse sequence PS2 and a third pulse sequence PS3 as they can be used for the method according to the invention are schematically depicted in FIG. 4.

The radio-frequency pulses and signals of the respective pulse sequence are thereby respectively indicated in the upper three lines of FIG. 4, in which the first, second and third pulse sequence PS1, PS2, PS3 are to be differentiated. In each pulse sequence PS1, PS2, PS3, an echo signal 403.1, 403.2, 403.3 which is measured as measurement data is generated after an RF excitation pulse 401.1, 401.2 401.3. Furthermore, a non-resonant RF pulse 402.2, 402.3 is radiated after the associated RF excitation pulse 401.2, 401.3 in only two of the three pulse sequences PS1, PS2, PS3. The non-resonant RF pulses 402.2, 402.3 differ. The frequency of the non-resonant RF pulse 402.2 of the second pulse sequence PS2 deviates by the same absolute value as the frequency of the non-resonant RF pulse 402.3 of the third pulse sequence PS3, but in the opposite direction, from the frequency of the RF excitation pulse 401.2, 401.3 of the pulse sequence PS2, PS3.

For example, the non-resonant RF pulses are designed as Fermi pulses (with the use of block simulations, for example) such that an optimally small excitation occurs in the resonance range of the examined spin ("on-resonance"), for example below 1% given resonance shifts of below 800 Hz, and such that the frequency difference of a non-resonant RF pulse of the second and/or third pulse sequence from the frequency of the RF excitation pulse is selected such that the respective resulting phase shift is large enough in order to improve the precision of the following determination of the B1 distribution. This means that the frequency difference of a non-resonant RF pulse can be chosen to be smaller relative to the system frequency (frequency of the excitation pulse) than has previously been possible in the prior art, without unwanted errors of the determined B1 amplitude occurring, in particular due to resonance shifts. Adulterations of the determined B1 amplitudes due to resonance shifts can be effectively limited by the calculation of the B1 amplitudes from the relevant phase shift that is proposed here. It is possible to select the difference of the frequency of the non-resonant RF pulse from the system frequency $v_{RF}$ to be markedly smaller than has previously been the case in the prior art, without resonance shifts leading to an alarming adulteration of the B1 amplitudes. A reduction of the frequency difference $v_{RF}$ results in an increase of the Bloch-Siegert phase shift $\phi_{BS}^{mod}$ (see Equations (1) or (7)), which has a positive effect on the achievable statistical precision of the determined Bloch-Siegert phase shifts $\phi_{BS}^{mod}$, and therefore the determined B1 amplitudes.

This advantage of the small possible frequency differences can moreover be utilized in order to shorten the pulse duration of the non-resonant RF pulse. Since the measurement duration of a Bloch-Siegert sequence is provided to a significant degree in that wait times that are necessary for the limitation of the specific absorption rate (SAR) must be introduced, the entire measurement duration can likewise be markedly shortened by shortening the non-resonant RF pulse. The additionally required measurement duration for the additional measurement of the reference phase can therefore be compensated.

It is also possible to extract the measurement without non-resonant RF pulse to determine the reference phase from measurements that are required for the determination of the phase position of various transmission channels in multichannel transmission operation when such a multichannel technique is used. An additional measurement duration for the determination of the reference phase, as would otherwise be necessary, is thereby omitted.

For example, in the cited article by Sacolick et al. a frequency difference of $v_{RF}$=4000 Hz was chosen. With the method described herein, under otherwise identical conditions a frequency difference of $v_{RF}$=2000 Hz leads to better results without errors of the determined B1 amplitudes degrading the result quality.

Analogous to FIG. 1, the lower four lines in FIG. 4 indicate the respective associated gradients $G_x$, $G_y$, $G_z$ to be switched in the x-, y- and z-direction and the data acquisition ADC, which are the same in each of the pulse sequences PS1, PS2, PS3. The indicated pulse sequences PS1, PS2, PS3 are also presented here in a gradient echo realization. However, it is also possible to use a different known sequence type, wherein furthermore the first pulse sequence PS1, the second pulse sequence PS2 and the third pulse sequence PS3 merely differ from the third pulse sequence (here PS1 [sic]) by the non-resonant RF pulses 402.2, 402.3 that are preset only in two of the three pulse sequences PS1, PS2, PS3, and the non-resonant RF pulses 402.2 and 402.3 are different non-resonant RF pulses. The non-resonant RF pulses 402.2 and 402.3 hereby differ in particular only in their frequency, meaning that they are modulated differently. The pulse shape is hereby the same in both non-resonant RF pulses 402.2 and 402.3.

In an example of a realization of the method described here, with a 3T magnetic resonance apparatus it could be shown that reliable results can be achieved even given severe resonance shifts. Non-resonant RF pulses (Bloch-Siegert pulses) with a pulse duration of 4 milliseconds were used which were modulated given a frequency shift of $v_{RF}$=2000 Hz relative to the system frequency. The pulse shape of the non-resonant RF pulses hereby follows a Fermi pulse that can be described by:

$$B_1^{norm}(t) = \frac{1}{1 + \exp\left(\left(\left|\frac{T}{2} - t\right| - \frac{T}{2} + A\right)/w\right)}, \tag{8}$$

for example with parameters: pulse duration T=4 ms, A=0.391 ms and
w=0.125 ms. The amplitude of an RF pulse generated in this way amounted to $B_1^{peak}$=5.59 μT.

The resonance shift was simulated by varying the system frequency. The measurement shows that a relative error of at most 11% occurred for resonance shifts in the range of up to 800 Hz according to the original method according to Sacolick with the selected Bloch-Siegert pulse. In contrast to this, the maximum error can be reduced to 2% with the method proposed here.

The use of a (possibly error-ridden) B0 map—via which the distribution of the basic magnetic field and resonance shifts due to chemical shift and susceptibility differences are quantified—can be omitted.

Although modifications and changes may be suggested by those skilled in the art, it is the intention of the inventor to embody within the patent warranted hereon all changes and modifications as reasonably and properly come within the scope of his contribution to the art.

We claim as our invention:
1. A method to determine a subject-specific distribution of radio-frequency (RF) energy radiated into an examination subject (B1 distribution) in a measurement volume of a magnetic resonance (MR) apparatus, comprising:
   operating the MR apparatus in order to acquire a first measurement data set of the examination subject using a first MR pulse sequence in which an RF excitation pulse is emitted at an excitation frequency that corresponds to a resonant frequency of predetermined nuclear spins of the subject, and in which no off-resonant excitation pulse is emitted;
   operating the MR apparatus in order to acquire MR signals in a second measurement data set of the examination subject using a second MR pulse sequence that differs from said first MR pulse sequence only by a first off-resonant excitation pulse being emitted in said second pulse sequence, said second MR pulse sequence also having an RF excitation pulse at said resonant frequency;
   operating the MR apparatus in order to acquire MR signals in a third measurement data set of the examination subject using a third MR pulse sequence, which differs from said first MR pulse sequence only by a second off-resonant excitation pulse being emitted in said third MR pulse sequence, said second off-resonant excitation pulse differing from said first off-resonant excitation pulse, with said third MR pulse sequence also having an RF excitation pulse at said resonant frequency;

supplying said first, second and third measurement data sets to a computerized processor and, in said processor, automatically determining a first phase of said MR signals from the first measurement data set, a second phase from the second measurement data set, and a third phase of said MR signals from the third measurement data set;

in said processor, calculating a phase shift from said determined first phase, said determined second phase and said determined third phase; and in said processor, determining the B1 distribution from the calculated phase shifts and making the determined B1 distribution available in electronic form at an output of said processor.

2. A method as claimed in claim 1 comprising operating said MR apparatus with said second and third MR pulse sequences differing from said first MR pulse sequence by radiation of the first or second off-resonant excitation pulse after the respective RF excitation pulse in the first and second pulse sequences.

3. A method as claimed in claim 1 comprising operating said MR apparatus with a frequency of said first off-resonant excitation pulse of said second MR pulse sequence deviating from a frequency of the RF excitation pulse of said second MR pulse sequence by a same absolute value as a frequency of the second off-resonant excitation pulse of the third MR pulse sequence, but in an opposite direction.

4. A method as claimed in claim 1 comprising, in said processor, calculating said phase shift from said determined first phase, said determined second phase and said determined third phase using a computational algorithm that eliminates any resonance shift from the calculation of the phase shift.

5. A method as claimed in claim 1 comprising, in said processor, calculating said phase shift by subtracting said determined first phase from the smaller of said determined second phase and said determined third phase, and subtracting the larger of the determined second phase and the determined third phase from said determined first phase.

6. A method as claimed in claim 1 comprising calculating said phase shift as the reciprocal of one-half of a sum of the reciprocal of a difference of said determined first phase and the smaller of said determined second phase and said determined third phase, and the reciprocal of a difference of the larger of said determined second phase and said determined third phase, and said determined first phase.

7. A method as claimed in claim 1 comprising operating said MR apparatus with at least one of a frequency difference between said first off-resonant excitation pulse the RF excitation pulse of said second MR pulse sequence, and a frequency difference between said second off-resonant excitation pulse and the RF excitation pulse of the third MR pulse sequence, being selected in order to cause said phase shift to be of a size that improves a precision of said determination, of said B1 distribution.

8. A magnetic resonance (MR) apparatus comprising:

an MR data acquisition unit comprising a basic field magnet, a gradient field system and a radio-frequency (RF) antenna, said RF antenna being configured to radiate RF energy into an examination subject in the data acquisition apparatus, thereby causing a distribution of said RF energy (B1 distribution) in a measurement volume of the data acquisition unit;

a control unit configured to operate said data acquisition unit;

said control unit being configured to operate the data acquisition unit in order to acquire MR signals in a first measurement data set of the examination subject using a first MR pulse sequence in which an RF excitation pulse is emitted at an excitation frequency that corresponds to a resonant frequency of predetermined nuclear spins of the subject, and in which no off-resonant excitation pulse is emitted;

said control unit being configured to operate the data acquisition unit in order to acquire MR signals in a second measurement data set of the examination subject using a second MR pulse sequence that differs from said first MR pulse sequence only by a first off-resonant excitation pulse being emitted in said second MR pulse sequence;

said control unit being configured to operate the data acquisition unit in order to acquire MR signals in a third measurement data set of the examination subject using a third magnetic resonance pulse sequence, which differs from said first MR pulse sequence only by a second off-resonant excitation pulse being emitted in said third MR pulse sequence, said-second off-resonant excitation pulse differing from said first off-resonant excitation pulse;

a computerized processor supplied with said first, second and third measurement data sets, said processor being configured to automatically determine a first phase of said MR signals from the first measurement data set, a second phase of the MR signals from the second measurement data set, and a third phase of the MR signals from the third measurement data set;

said processor being configured to calculate a phase shift from said determined first phase, said determined second phase and said determined third phase; and said processor being configured to determine the B1 distribution from the calculated phase shifts and configured to make the determined B1 distribution available in electronic form at an output of said processor.

9. A non-transitory, computer-readable data storage medium encoded with programming instructions, said storage medium being loaded into a computerized control and evaluation system of a magnetic resonance (MR) apparatus, said MR apparatus comprising a data acquisition unit in which MR data are acquired by radiating radio-frequency (RF) energy into an examination subject with a distribution of said RF energy (B1 distribution) in a measurement volume of the data acquisition unit, said programming instructions causing said control and evaluation system to:

operate the data acquisition unit in order to acquire MR signals in a first measurement data set of the examination subject using a first magnetic resonance pulse sequence in which an RF excitation pulse is emitted at an excitation frequency that corresponds to a resonant frequency of predetermined nuclear spins of the subject, and in which no off-resonant excitation pulse is emitted;

operate the data acquisition unit in order to acquire MR signals in a second measurement data set of the examination subject using a second MR pulse sequence that differs from said first MR pulse sequence only by a first off-resonant excitation pulse being emitted in said second MR pulse sequence;

operate the data acquisition unit in order to acquire MR signals in a third measurement data set of the examination subject using a third magnetic resonance pulse sequence, which differs from said first MR pulse sequence only by a second off-resonant excitation pulse being emitted in said third MR pulse sequence, said second off-resonant excitation pulse differing from said first off-resonant excitation pulse;

determine a first phase of the MR signals from the first measurement data set, a second phase of the MR signals from the second measurement data set, and a third phase of the MR signals from the third measurement data set;

calculate a phase shift from said determined first phase, said determined second phase and said determined third phase; and determine the B1 distribution from the calculated phase shifts and make the determined B1 distribution available in electronic form at an output of said control and evaluation system.

* * * * *